United States Patent
Park et al.

(10) Patent No.: US 9,026,762 B2
(45) Date of Patent: May 5, 2015

(54) SEMICONDUCTOR SYSTEM INCLUDING A CONTROLLER HAVING REDUCED NUMBER OF MEMORY BUFFERS FOR TRANSMITTING DATA TO A PLURALITY OF MEMORY CHIPS

(75) Inventors: Jin Su Park, Icheon-si (KR); Gi Pyo Um, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 666 days.

(21) Appl. No.: 13/341,505

(22) Filed: Dec. 30, 2011

(65) Prior Publication Data

US 2013/0114349 A1    May 9, 2013

(30) Foreign Application Priority Data

Nov. 3, 2011    (KR) .................. 10-2011-0113673

(51) Int. Cl.
*G06F 11/16*    (2006.01)
*G06F 12/06*    (2006.01)
*G11C 7/10*    (2006.01)
*G06F 11/14*    (2006.01)

(52) U.S. Cl.
CPC .......... *G11C 7/1087* (2013.01); *G06F 11/1402* (2013.01); *G06F 11/1666* (2013.01); *G06F 12/0607* (2013.01); *G11C 7/1039* (2013.01); *G11C 7/106* (2013.01)

(58) Field of Classification Search
CPC ............ G06F 12/0238; G06F 12/0246; G06F 12/0607; G06F 11/1402; G06F 11/1666
USPC .......................................... 711/103, 167, 169
See application file for complete search history.

(56) References Cited

U.S. PATENT DOCUMENTS

| | | | |
|---|---|---|---|
| 7,684,256 B2 | 3/2010 | Kim | |
| 8,433,859 B2* | 4/2013 | Chien et al. | 711/154 |
| 2008/0025095 A1 | 1/2008 | Ahn et al. | |
| 2008/0175065 A1* | 7/2008 | Choi et al. | 365/185.22 |
| 2008/0209110 A1* | 8/2008 | Pyeon et al. | 711/103 |
| 2008/0209266 A1* | 8/2008 | Lee et al. | 714/16 |
| 2010/0318721 A1* | 12/2010 | Avila et al. | 711/103 |

OTHER PUBLICATIONS

Jeong-Uk Kang et al., A multi-channel architecture for high-performance NAND flash-based storage system, Journal of Systems Architecture, Feb. 1, 2007, p. 644-658, Republic of Korea.

* cited by examiner

*Primary Examiner* — Hal Schnee
(74) *Attorney, Agent, or Firm* — William Park & Associates Ltd.

(57) ABSTRACT

A semiconductor system includes three or more memory chips and a controller with first and second memory buffers configured to communicate with the three or more memory chips. The first and second memory buffers alternately transmit data to sequentially communicate with the three or more memory chips.

9 Claims, 7 Drawing Sheets

SEMICONDUCTOR SYSTEM INCLUDING A CONTROLLER HAVING REDUCED NUMBER OF MEMORY BUFFERS FOR TRANSMITTING DATA TO A PLURALITY OF MEMORY CHIPS

CROSS-REFERENCES TO RELATED APPLICATION

The present application claims priority under 35 U.S.C. §119(a) to Korean application number 10-2011-0113673 filed on Nov. 3, 2011 in the Korean Intellectual Property Office, which is incorporated by reference in its entirety.

BACKGROUND

1. Technical Field

The present invention relates to a semiconductor apparatus, and more particularly, to a semiconductor system including a controller and a memory.

2. Related Art

In order to improve the integration degree and capacity of a semiconductor apparatus, or particularly, a memory, a semiconductor system including a plurality of memory chips and a controller to control the plurality of memory chips has been proposed. The controller includes a plurality of memory buffers to communicate with the plurality of memory chips.

Figure 1:
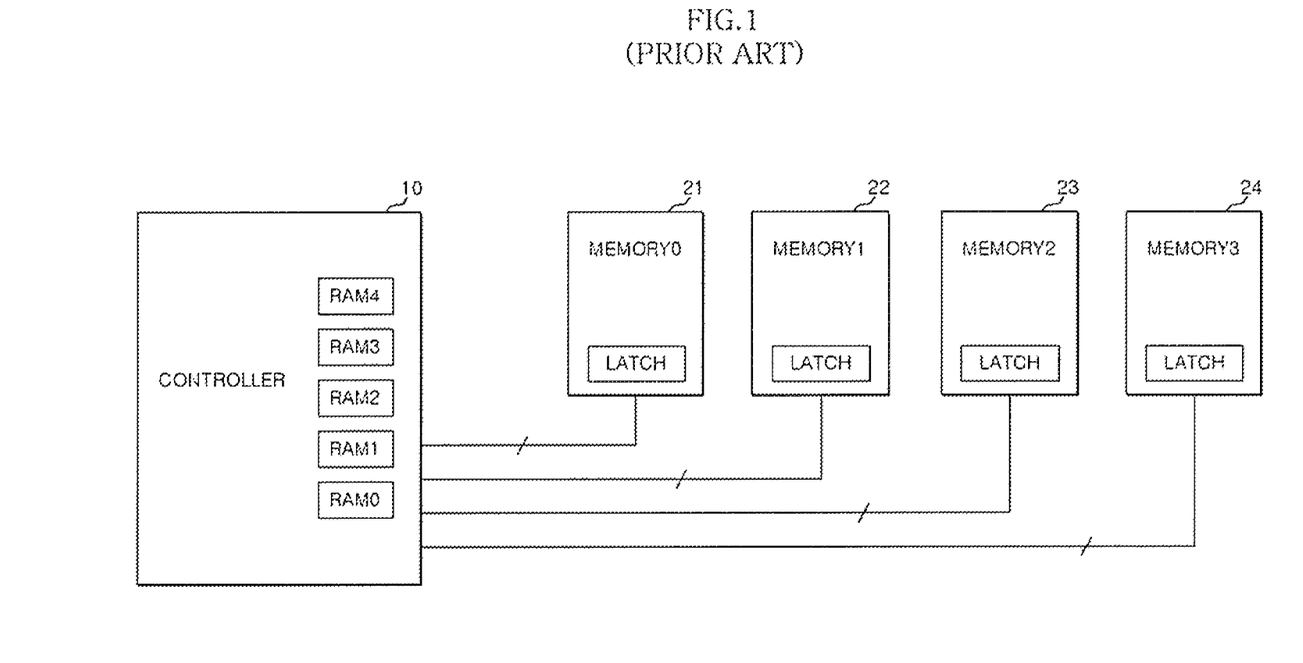
FIG. 1 illustrates the configuration of a conventional semiconductor system.

FIG. 1 illustrates the configuration of a conventional semiconductor system. The semiconductor system includes a controller 10 and a plurality of memory chips MEMORY0 to MEMORY3 (21 to 24). The controller 10 includes memory buffers RAM0 to RAM4 to communicate with the first to fourth memory chips 21 to 24. The controller 10 basically includes four memory buffers RAM0 to RAM3 corresponding to the number of the first to fourth memory chips 21 to 24 and further include an extra memory buffer RAM4 for dealing with a case in which a data programming fail occurs. The controller 10 including the memory buffers RAM0 to RAM4 performs data communication with the first to fourth memory chips 21 to 24. That is, the memory buffers RAM0 to RAM4 are provided to write data to the first to fourth memory chips 21 to 24 or receive data read from the first to fourth memory chips 21 to 24. Each of the first to fourth memory chips 21 to 24 includes a latch unit LATCH configured to temporarily store data transmitted from the respective memory buffers RAM0 to RAM4 of the controller 10 and a memory cell array configured to store the data stored in the latch unit LATCH.

Figure 2:
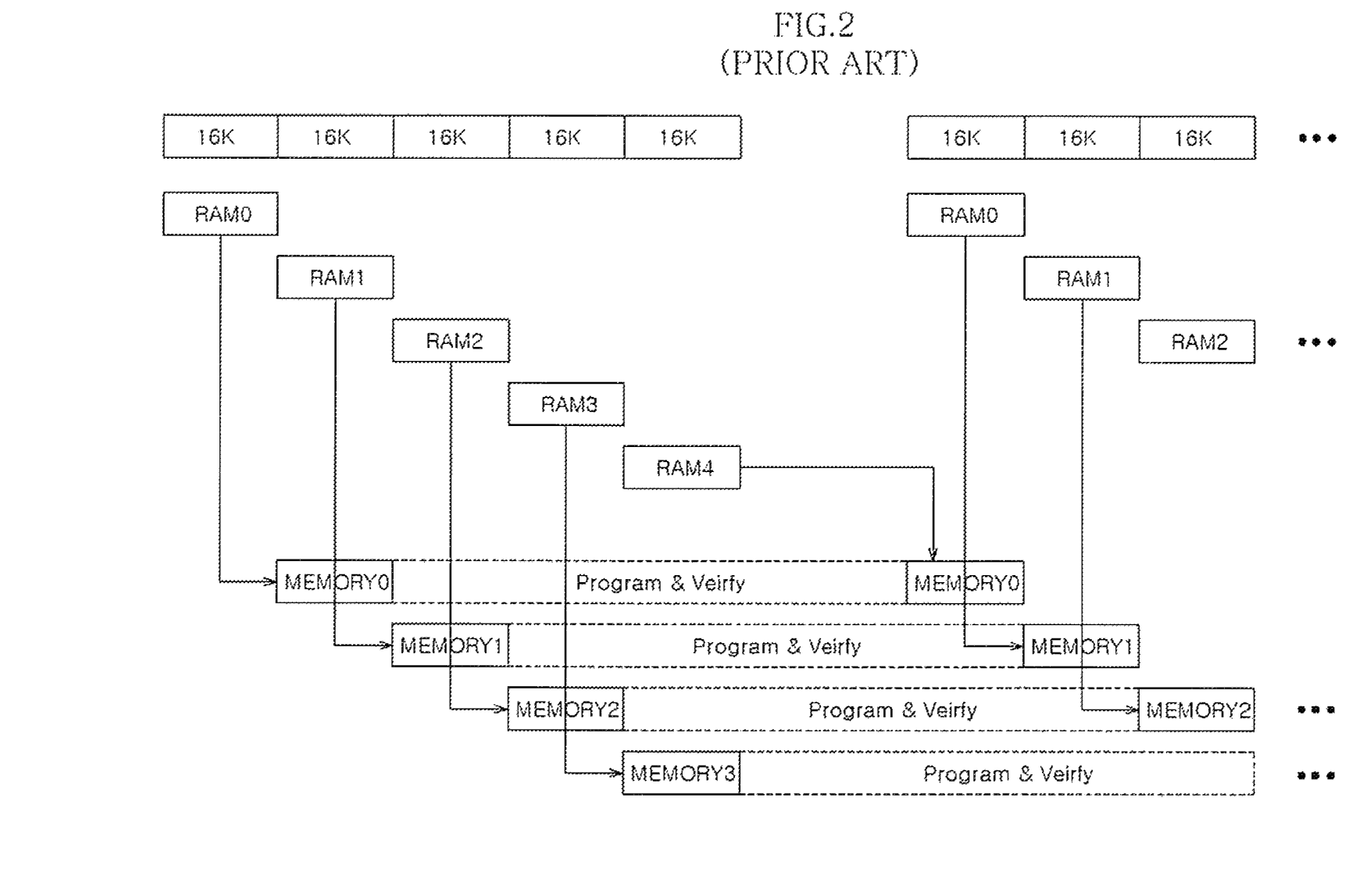
FIG. 2 illustrates an operation of the semiconductor system of FIG. 1.

FIG. 2 illustrates the operation of the semiconductor system of FIG. 1. In particular, FIG. 2 illustrates a data write operation of the semiconductor system. The first to fourth memory buffers RAM0 to RAM3 sequentially transmit data to the first to fourth memory chips MEMORY0 to MEMORY3, and the first to fourth memory chips MEMORY0 to MEMORY3 program the transmitted data into memory cells. The first to fourth memory chips MEMORY0 to MEMORY3 performs the data write operation by performing a data program and verify operation. When all of the first to fourth memory chips MEMORY0 to MEMORY3 successfully perform the data program operation, the fifth memory buffer RAM4 transmits data to the first memory chip MEMORY0, and the first to third memory buffers RAM0 to RAM2 transmit data to the second to fourth memory chips MEMORY1 to MEMORY3, respectively. The first to fifth memory buffers RAM0 to RAM4 maintain the data until they check whether the data transmitted to the first to fourth memory chips MEMORY0 to MEMORY3 were successfully programmed. Therefore, when the programming has succeeded, each of the memory buffers RAM0 to RAM5 erases the data stored therein, receives and stores new data, and prepares the next data write operation.

Figure 3:
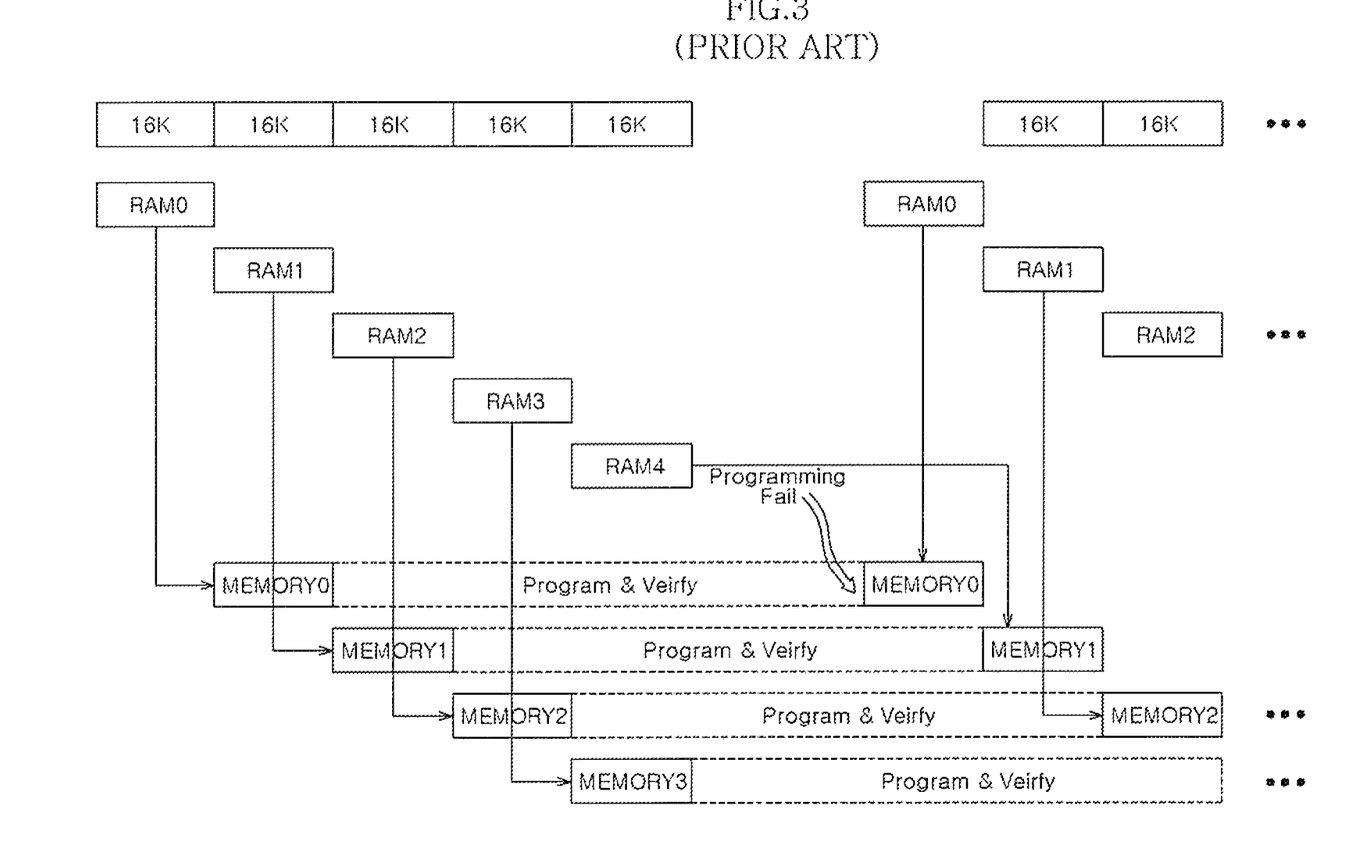
FIG. 3 illustrates an operation of the semiconductor system of FIG. 1, when a program fail occurs.

Referring to FIG. 3, the semiconductor system includes a larger number of memory buffers than the number of the memory chips in order to deal with a case in which a programming fail occurs. When a programming fail occurs, data in which a fail occurs should be reprogrammed into a corresponding memory chip. In FIG. 3, when a programming fail occurs in the first memory chip MEMORY0, the first memory buffer RAM0 does not erase the data that failed to program correctly, but maintains the data. Furthermore, the first memory buffer RAM0 is not updated to store new data. The maintained data is retransmitted to the first memory chip MEMORY0 from the first memory buffer RAM0 during the next data program operation, and the first memory chip MEMORY0 reprograms the data. Therefore, the fifth memory buffer RAM4 transmits new data to the second memory chip MEMORY1, and the second memory chip MEMORY1 programs the data transmitted from the fifth memory buffer RAM4 into a memory cell.

Conventional semiconductor systems include more memory buffers than the number of the memory chips. This configuration causes an area increase of the controller, and reduces the efficiency of the program operation.

SUMMARY

A semiconductor system capable of improving a reprogram operation of a memory chip and efficiently a memory buffer included in a controller is described here.

In one embodiment of the present invention, a semiconductor system includes three or more memory chips and a controller with first and second memory buffers configured to communicate with the three or more memory chips. The first and second memory buffers alternately transmit data to sequentially is communicate with the three or more memory chips.

In another embodiment of the present invention, a semiconductor system includes a first latch in a memory device configured to receive and store data from a controller, and a second latch in the memory device configured to receive data from the first latch, store the received data, and program the stored data into a memory cell. When the data programming is unsuccessful, the first latch does not receive new data from the controller, and the second latch transmits the data to the first latch.

In another embodiment of the present invention, a semiconductor system includes a controller including first and second memory buffers and first to third memory chips configured to communicate with the controller. The first and second memory buffers alternately and sequentially transmit data to the first to third memory chips, and are updated with new data, regardless of whether the data is successfully programmed into the first to third memory chips.

BRIEF DESCRIPTION OF THE DRAWINGS

Features, aspects, and embodiments are described in conjunction with the following drawings.

DETAILED DESCRIPTION

A semiconductor system according to the present invention will be described below with reference to the accompanying drawings through exemplary embodiments.

Figure 4:
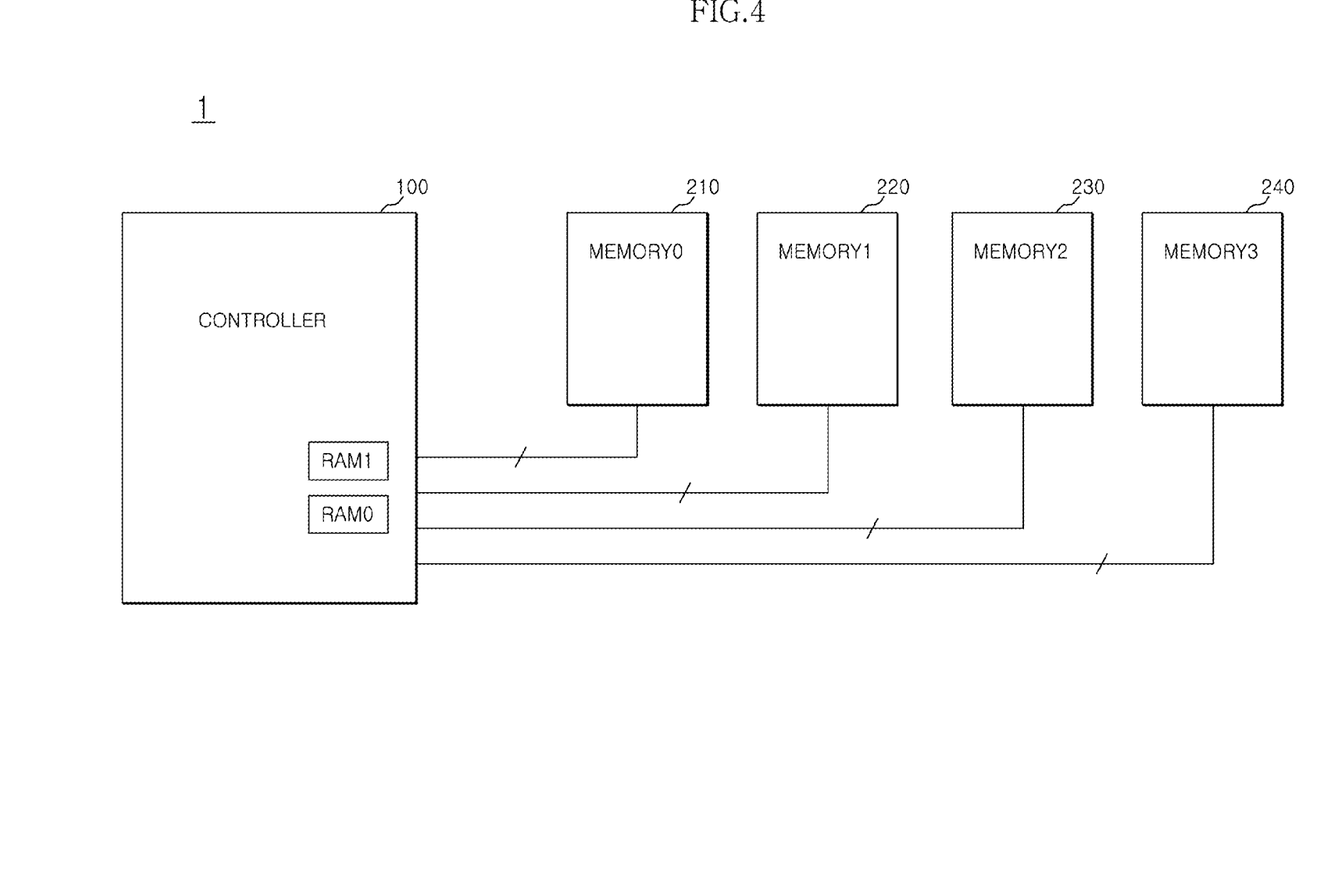
FIG. 4 illustrates an exemplary configuration of a semiconductor system according to one embodiment of the invention.

FIG. 4 illustrates an exemplary configuration of a semiconductor system according to one embodiment of the invention. In FIG. 4, the semiconductor system 1 includes a controller 100 and a plurality of memory chips MEMORY0 to MEMORY3 (210 to 240). FIG. 4 illustrates that the semiconductor system 1 includes the first to fourth memory chips 210 to 240, but the number of memory chips is not limited thereto. The controller 100 includes first and second memory buffers RAM0 and RAM1.

The controller 100 is configured to communicate with the first to fourth memory chips 210 to 240 through the first and second memory buffers RAM0 to RAM1. During a data write operation, the first and second memory buffers RAM0 and RAM1 alternately transmit data to the first to fourth memory chips 210 to 240. Furthermore, the first and second memory buffers RAM0 and RAM1 sequentially transmit data to the first to fourth memory chips 210 to 240. Therefore, the controller 100 may include only the first and second memory buffers RAM0 and RAM1 to communicate with the first to fourth memory chips 210 to 240.

The first and second memory buffers RAM0 and RAM1 are updated to transmit data to the first to fourth memory chips 210 to 240. For example, when the first memory buffer RAM0 transmits data to the first memory chip 210, then the first memory buffer RAM0 stores new data to be transmitted to another memory chip.

The first and second memory buffers RAM0 and RAM1 are updated to store new data regardless of whether the data transmitted to the first to fourth memory chips 210 to 240 are successfully programmed. Conventionally, updating data in a memory buffer is based on whether that data was successfully programmed in a memory chip. However, the first and second memory buffers RAM0 and RAM1 according to an embodiment are immediately updated with new data after data transmission is completed regardless of whether the programming is successful. Therefore, the controller 100 does is not need to include a plurality of memory buffers corresponding to the number of the memory chips.

The first to fourth memory chips 210 to 240 may have the same structure as each other. For example, the first to fourth memory chips 210 to 240 may include flash memory devices, but are not limited thereto. During the data write operation, each of the first to fourth memory chips 210 to 240 receives data from the first and second memory buffers RAM0 and RAM1, and programs the received data into a memory cell. Furthermore, the first to fourth memory chips 210 to 240 receive address information from the controller 100, and program the received data into a memory cell at a position corresponding to the address information. When the programming is successfully performed, the first to fourth memory chips 210 to 240 receive new data from one of the first and second memory buffers RAM0 and RAM1, and perform the next data write operation. When the programming has failed, the first to fourth memory chips 210 to 240 do not receive new data from the first and second memory buffers RAM0 to RAM1. When a programming fail occurs, the first to fourth memory chips 210 to 240 internally store data in which the fail occurred, and reprogram the stored data into a memory cell at a different position based on different address information during the next data write operation.

Figure 5:
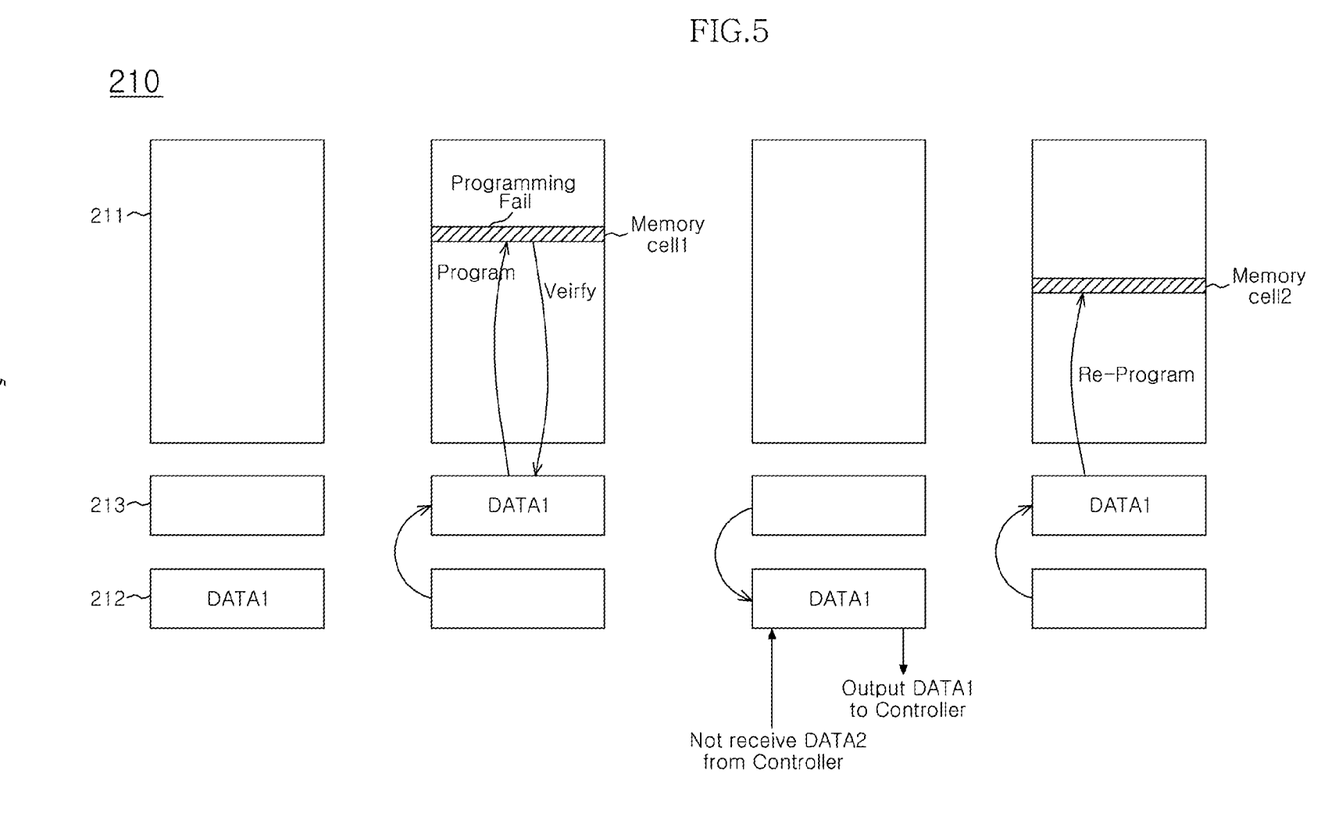
FIG. 5 is a diagram illustrating the configuration of a first memory chip 210 of FIG. 4 and an operation of the first memory chip 210 when a programming fail occurs.

FIG. 5 is a diagram illustrating the configuration of the first memory chip 210 of FIG. 4 and the operation of the first memory chip 210 when a programming fail occurs. In FIG. 5, the first memory chip 210 includes a memory cell block 211, a first latch 212, and a second latch 213. The memory cell block 211 includes a plurality of memory cells where data are programmed. The first latch 212 may correspond to a cache latch, and is configured to receive and store data DATA1 transmitted from the first and second memory buffers RAM0 and RAM1. The second latch 213 may correspond to a main latch, and is configured to store the data DATA1 transmitted from the first latch 212 and program the data into the memory cell block 211. After transmitting the data to the second latch 213, the first latch 212 receives and stores new data DATA2 from the first and second memory buffers RAM0 and RAM1. The second latch 213 programs the data into the memory cell block 211 and verifies the programmed data. Whether the programming is successful may be determined by the verification operation. When the data is successfully programmed into a memory cell Memory cell1, the second latch 213 receives new data DATA2 from the first latch 212 and performs the next data programming operation.

When the data is not successfully programmed in the memory cell, the first latch 212 does not receive new data DATA2 from the first and second memory buffers RAM0 and RAM1. Furthermore, the second latch 213 transmits the data DATA1 in which the fail occurred to the first latch 212. The first latch 212 then stores the data DATA1 in which the programming fail occurred, and transmits the data DATA1 to the second latch 213 during the next write operation. The second latch 213 receives the data DATA1 from is the first latch 212 and reprograms the data into another memory cell Memory cell2.

In an embodiment of the present invention, the first latch 212 may transmit the data DATA1 in which the programming fail occurred to the controller 100. The controller 100 reuses the data transmitted from the first latch 212. For example, the controller 100 may store data outputted from the first latch 212 in a memory buffer, and transmit the data to a memory chip to perform a reprogram operation.

Figure 6:
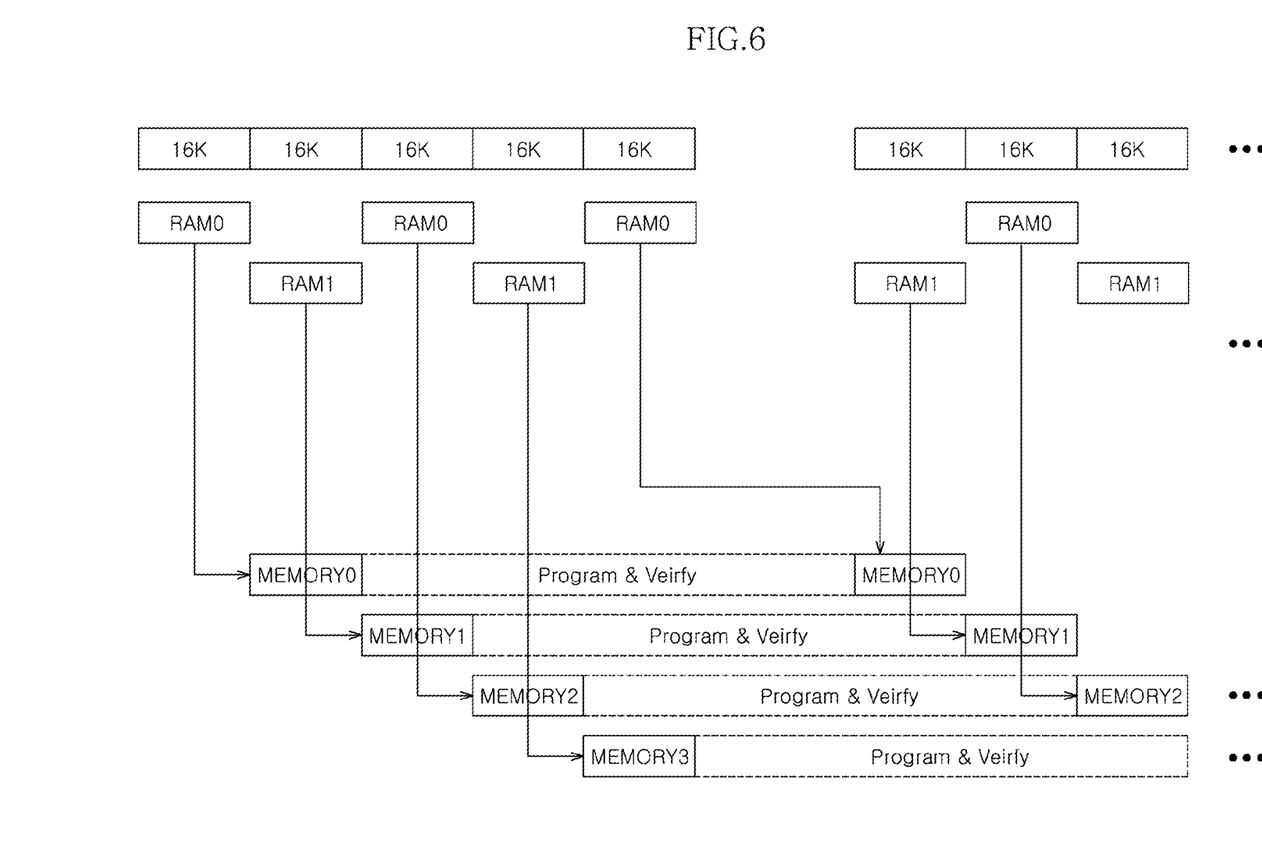
FIG. 6 is a diagram illustrating an operation of the semiconductor system according to an embodiment of the invention.

FIG. 6 is a diagram illustrating the operation of the semiconductor system according to an embodiment of the invention. In FIG. 6, the size of data transmitted by the first and second memory buffers RAM0 and RAM1 is set to 16 KB, but is not limited thereto. When the first and second memory buffers RAM0 and RAM1 transmit data to the first to fourth memory chips MEMORY0 to MEMORY3, the first and second memory buffers RAM0 and RAM1 are immediately updated to store new data. Therefore, the first and second memory buffers RAM0 and RAM1 may alternately transmit data, and sequentially transmit data to the first to fourth memory chips MEMORY0 to MEMORY3.

The first memory buffer RAM0 transmits data to the first memory chip MEMORY0, and is updated with new data. The second memory buffer RAM1 also transmits data to the second memory chip MEMORY1, and is updated with new data. The first memory buffer RAM0 transmits the new data to the third memory chip MEMORY2, and is updated with new data. The second memory buffer RAM1 also transmits the new data to the fourth memory chip MEMORY3 and is updated with new data. Each of the first to fourth memory chips MEMORY0 to MEMORY3 receives data from the first and second memory buffers RAM0 and RAM1 and performs a program and verify operation. Since the programming was successfully performed in the first memory chip MEMORY0, the first memory chip MEMORY0 receives new data and continues to perform programming.

In the semiconductor system 1 according to an embodiment of the invention, since the memory buffers RAM0 and RAM1 of the controller 100 do not maintain data transmitted to the first to fourth memory chips MEMORY0 to MEMORY3 but are updated to store new data as illustrated in FIG. 6, the number of memory buffers is not increased although the number of memory chips is increased. Therefore, the size or number of memory buffers of the controller may be reduced, and the memory buffers may be efficiently used.

Figure 7:
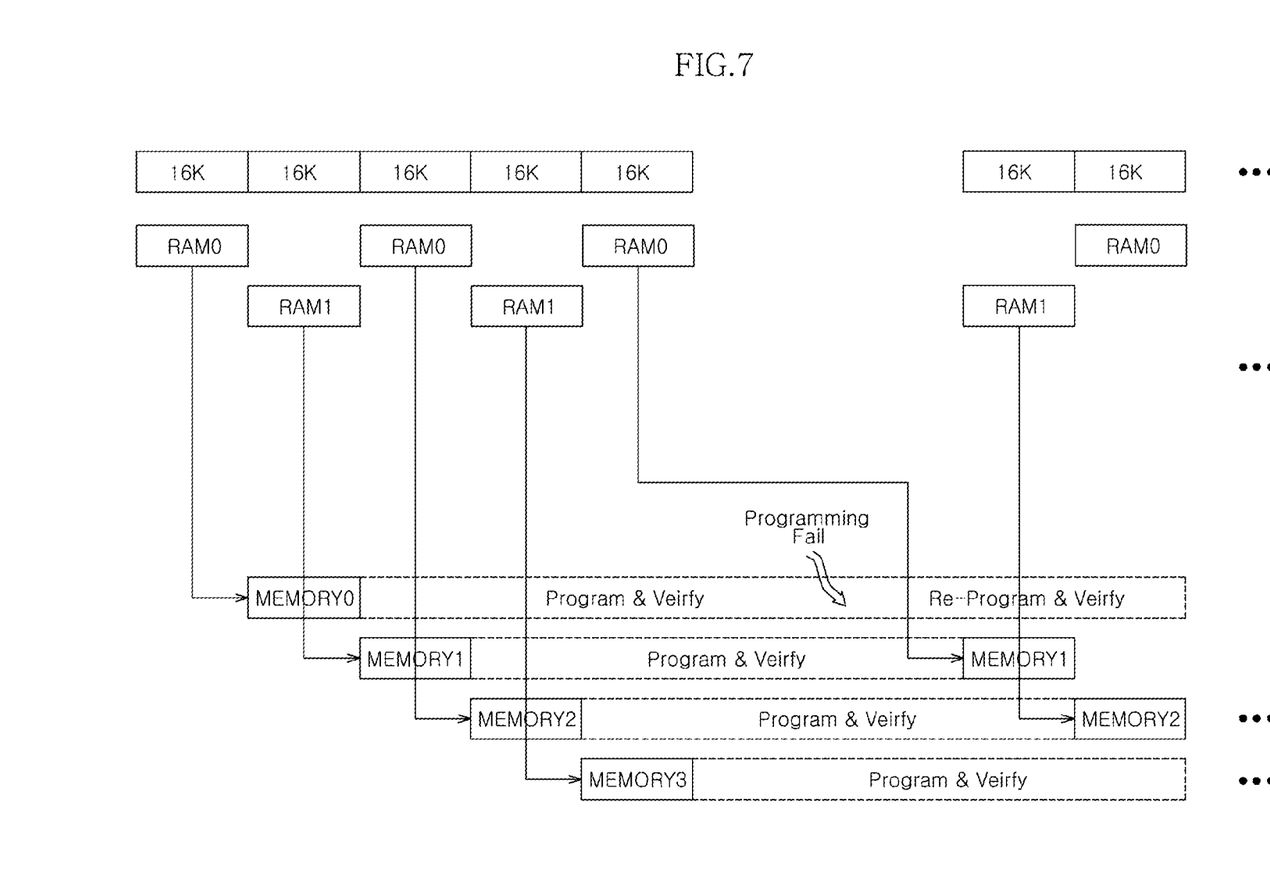
FIG. 7 is a diagram illustrating an operation of the semiconductor system according to an embodiment of the invention when a programming fail occurs.

FIG. 7 is a diagram illustrating an operation of the semiconductor system according to an embodiment of the invention, when a programming fail occurs. FIG. 7 illustrates a case in which a programming fail occurs in the first memory chip MEMORY0. When the programming fail occurs, the first memory buffer RAM0 does not transmit data to the first memory chip MEMORY0 as would happen if the programming was successful, but transmits data to the second memory chip MEMORY1. The first memory chip MEMORY0 does not receive new data from the first memory buffer RAM0. When a programming fail occurs, the first memory chip MEMORY0 internally stores data in which the fail occurred using the first and second latches 212 and 213 illustrated in FIG. 4, and reprograms the data into another memory cell different from the memory cell in which the fail occurred.

As described above, when a programming fails occurs, the semiconductor system may reprogram data in which the fail occurred into a memory chip, regardless of a memory buffer. Therefore, after transmitting data to the memory chip, the memory buffer may be immediately updated with new data, and the number of memory buffers to perform data communication with the plurality of memory chips is reduced.

While certain embodiments have been described above, it will be understood to those skilled in the art that the embodiments described are by way of example only. Accordingly, the semiconductor system described herein should not be limited based on the described embodiments. Rather, the semiconductor system described herein should only be limited in light of the claims that follow when taken in conjunction with the above description and accompanying drawings.

What is claimed is:

1. A semiconductor system comprising:
   three or more memory chips; and
   a controller comprising first and second memory buffers configured to communicate with the three or more memory chips,
   wherein the first and second memory buffers alternately transmit data to sequentially communicate with the three or more memory chips,
   wherein if a programming fail occurs in one of the three or more memory chips, data which is not successfully programmed into one of the three or more memory chips due to the programming fail is transmitted to the controller,
   wherein, when the first and second memory buffers transmit data to one of the three or more memory chips, the first and second memory buffers are updated with new data,
   wherein each of the memory chips comprises a first latch configured to store data transmitted from one of the first and second memory buffers, and a second latch configured to receive and store data stored in the first latch and program the stored data therein into a memory cell,
   wherein when the programming fail occurs, the first latch does not receive new data from one of the first and second memory buffers,
   wherein, when the programming fail occurs, the second latch transmits the stored data therein to the first latch.

2. The semiconductor system according to claim 1, wherein the first latch transmits the stored data therein to the second latch during a next data program operation, and
   the second latch programs the received data from the first latch into another memory cell.

3. The semiconductor system according to claim 1, wherein the first latch outputs the stored data therein to the controller.

4. The semiconductor system according to claim 1, wherein the first and second memory buffers do not transmit new data to the memory chip in which the programming fail occurs until the data which is not successfully programmed into the memory chip is successfully programmed into the memory chip.

5. A semiconductor system comprising:
   a first latch in a memory device configured to receive and store data from a controller; and
   a second latch in the memory device configured to receive and store the stored data in the first latch, and program the stored data therein into a memory cell,
   wherein, when the data programming is unsuccessful, the first latch does not receive new data from the controller, and the second latch transmits the stored data therein to the first latch.

6. The semiconductor system according to claim 5, wherein when the data programming is unsuccessful, the first latch transmits the data, which is transmitted from the second latch and stored therein, to the second latch during a next data program operation, and
   the second latch programs the data which is transmitted from the first latch into another memory cell.

7. The semiconductor system according to claim 5, wherein the first latch outputs the stored data therein to the controller.

8. The semiconductor system according to claim 7, wherein the controller transmits the data received from the first latch back to the first latch for a next programming operation.

9. The semiconductor system according to claim 5, wherein, when the received data from the controller is successfully programmed, the first latch receives new data from the controller, and stores the received new data.

* * * * *